(12) United States Patent
Kim et al.

(10) Patent No.: US 8,993,388 B2
(45) Date of Patent: Mar. 31, 2015

(54) MANUFACTURING METHOD OF LIQUID CRYSTAL DISPLAY HAVING TOUCH SENSOR

(71) Applicant: Samsung Display Co., Ltd., Yongin, Gyeonggi-Do (KR)

(72) Inventors: Hyun-Young Kim, Yongin (KR); Ji-Ryun Park, Yongin (KR); Se-Il Cho, Yongin (KR); Ki-Hoon Kim, Yongin (KR); Jung-Sun Kim, Yongin (KR); Hee-Sang Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/079,452

(22) Filed: Nov. 13, 2013

(65) Prior Publication Data

US 2015/0004760 A1    Jan. 1, 2015

(30) Foreign Application Priority Data

Jun. 26, 2013  (KR) ........................ 10-2013-0073424

(51) Int. Cl.
*H01L 21/00*   (2006.01)
*H01L 29/66*   (2006.01)

(52) U.S. Cl.
CPC .............................. *H01L 29/66742* (2013.01)

USPC ......... 438/158; 438/50; 438/51; 257/E21.001

(58) Field of Classification Search
USPC .......................................................... 438/50
See application file for complete search history.

(56) References Cited

U.S. PATENT DOCUMENTS

| | | | |
|---|---|---|---|
| 2011/0012118 A1* | 1/2011 | Yamazaki et al. | ............... 257/59 |
| 2011/0279763 A1 | 11/2011 | Cho et al. | |
| 2012/0044191 A1 | 2/2012 | Shin | |
| 2013/0093706 A1* | 4/2013 | Kurasawa et al. | ............ 345/173 |

FOREIGN PATENT DOCUMENTS

| | | |
|---|---|---|
| KR | 10-2010-0061977 A | 6/2010 |
| KR | 10-2011-0126365 A | 11/2011 |
| KR | 10-2012-0017165 A | 2/2012 |
| KR | 10-2012-0069226 A | 6/2012 |

* cited by examiner

*Primary Examiner* — Angel Roman
(74) *Attorney, Agent, or Firm* — Christie, Parker & Hale, LLP

(57) ABSTRACT

A method of manufacturing a liquid crystal display having a touch sensor, the method including forming a plurality of thin film transistors on a first substrate, forming a plurality of pixel electrodes each coupled to a corresponding one of the thin film transistors, forming an insulating layer on the pixel electrodes, and forming, on the insulating layer, a plurality of first touch electrodes each having openings formed therein and a plurality of driving lines coupled to the first touch electrodes.

18 Claims, 8 Drawing Sheets

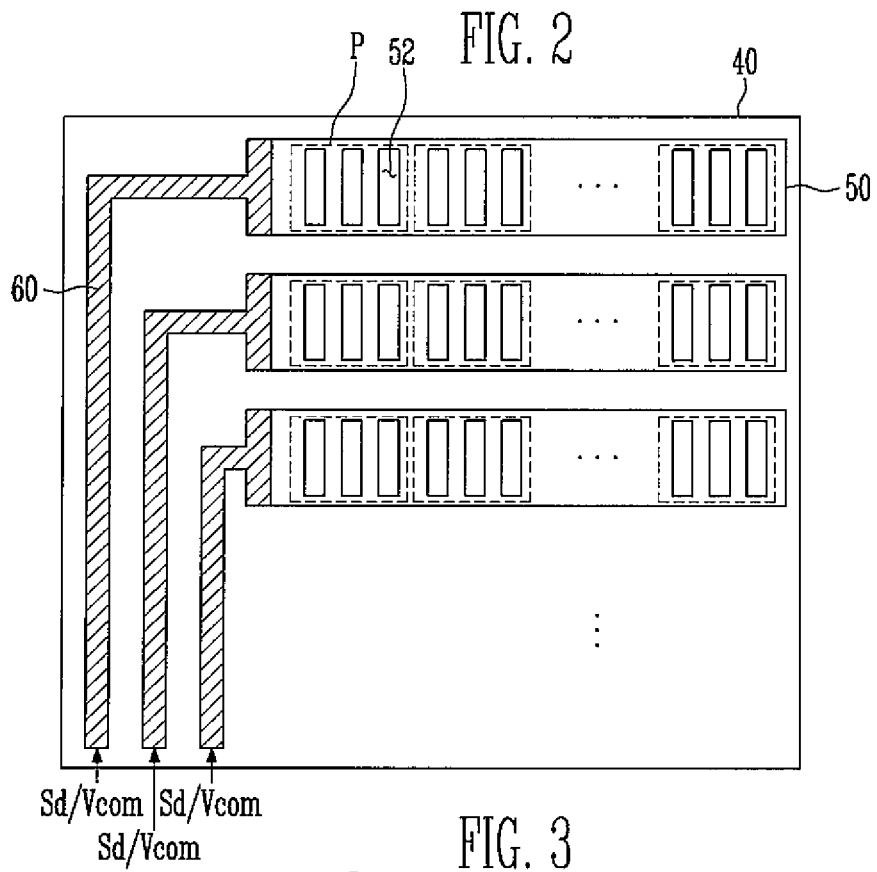
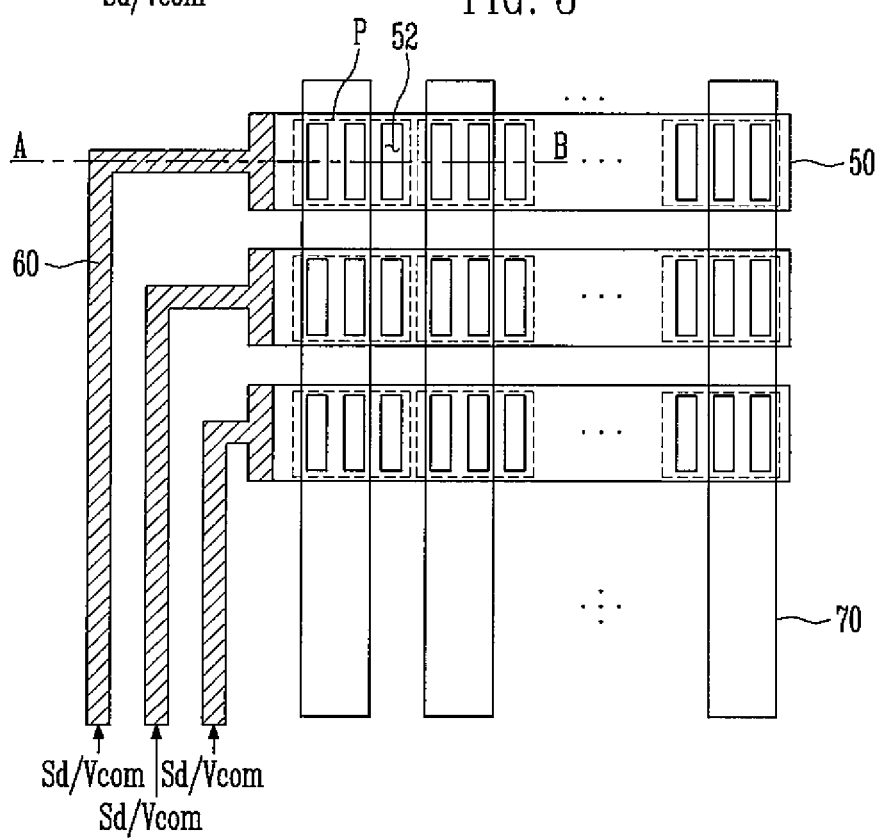

MANUFACTURING METHOD OF LIQUID CRYSTAL DISPLAY HAVING TOUCH SENSOR

CROSS-REFERENCE TO RELATED APPLICATION

This application claims priority to and the benefit of Korean Patent Application No. 10-2013-0073424, filed on Jun. 26, 2013, in the Korean Intellectual Property Office, the entire content of which is incorporated herein by reference.

BACKGROUND

1. Field

An aspect of the present invention relates to a manufacturing method of a liquid crystal display having a touch sensor.

2. Description of the Related Art

As interest in information display and the desire to use potable information media increase, research and commercialization have been increasingly concentrating upon lightweight and thin flat panel displays (FPDs) as substitutes for cathode ray tubes (CRTs). Particularly, a liquid crystal display (LCD) among these FPDs is a device which displays an image, using optical anisotropy of liquid crystals. The LCD has excellent resolution, color display, image quality, etc., and, thus, is actively applied in notebook computers, desktop monitors, etc.

Meanwhile, as users' requirements increase due to convenience of input on a touch screen, it is desired that the LCD provides a touch screen function of allowing a user's instruction to be input by selecting an instruction content displayed on a screen with a user's hand or object.

A touch sensor is a device which detects proximity (e.g., approach) or contact of a user's hand or object, so as to help a user's command to be input in a display or the like.

To this end, the touch sensor is provided in an image display screen to convert a contact position of a user's hand or object into an electrical signal. Accordingly, an instruction content selected at the contact position is received as an input signal.

Because the touch sensor can be substituted for a separate input device connected to an image display device, such as a keyboard or mouse, its areas of application have been gradually extended.

Touch sensors are divided into resistive overlay touch sensors, photosensitive touch sensors, capacitive touch sensors, and the like. Among these touch sensors, the capacitive touch sensor converts a contact position into an electrical signal by sensing a change in capacitance formed between a conductive sensing electrode and an adjacent sensing electrode or ground electrode when a user's hand or object comes in contact with the touch screen panel.

SUMMARY

According to an aspect of an embodiment according to the present invention, there is provided a method of manufacturing a liquid crystal display having a touch sensor, the method including: forming a plurality of thin film transistors on a first substrate; forming a plurality of pixel electrodes each coupled to a corresponding one of the thin film transistors; forming an insulating layer on the pixel electrodes; and forming, on the insulating layer, a plurality of first touch electrodes each having openings formed therein and a plurality of driving lines coupled to the first touch electrodes.

The forming of the thin film transistors may include: forming a gate electrode on the first substrate, and forming a gate insulating layer on the gate electrode; sequentially forming an active layer and a first metal layer on the gate insulating layer; and patterning the active layer and the first metal layer to form a source electrode, a drain electrode and an active pattern layer of the thin film transistors.

The forming of the source electrode, the drain electrode, and the active pattern layer of the thin film transistors may include: forming a first photoresist layer on the first metal layer; patterning the first photoresist layer, using a first half-tone mask, to form photoresist patterns spaced from each other, wherein each of the photoresist patterns includes a first photoresist pattern having a first height and second photoresist patterns having a second height; removing a portion of the first metal layer and a portion of the active layer exposed between the photoresist patterns; removing the first photoresist pattern; and removing a portion of the first metal layer exposed to the outside by removing the first photoresist pattern.

The forming of the source electrode, the drain electrode, and the active pattern layer of the thin film transistors may further include: removing a portion of the second photoresist patterns remaining after the removing of the portion of the first metal layer exposed to the outside by removing the first photoresist pattern.

After the removing of the portion of the first metal layer exposed to the outside by removing the first photoresist pattern, a portion of the first metal layer that remains may form the source or drain electrode, and a portion of the active layer that remains may form the active pattern layer.

The first height of the first photoresist pattern may be lower than the second height of the second photoresist patterns.

The second photoresist patterns may be coupled to both sides of the first photoresist pattern.

The forming of the first touch electrodes and the driving lines may include: sequentially forming a conductive layer and a second metal layer on the insulating layer; forming a second photoresist layer on the second metal layer; patterning the second photoresist layer, using a second half-tone mask, to form a third photoresist pattern having a third height and a fourth photoresist pattern having a fourth height; removing portions of the second metal layer and the conductive layer positioned in a region where the third and fourth photoresist patterns are not positioned; removing the third photoresist pattern; and removing a portion of the second metal layer exposed to the outside by removing the third photoresist pattern.

The forming of the first touch electrodes and the driving lines may further include: removing a portion of the fourth photoresist pattern remaining after the removing of the portion of the second metal layer exposed to the outside by removing the third photoresist pattern.

In the removing of the portion of the second metal layer exposed to the outside by removing the third photoresist pattern, a portion of the conductive layer that remains may form a corresponding one of the first touch electrodes, and a portion of the second metal layer that remains forms a corresponding one of the driving lines.

The third height of the third photoresist pattern may be lower than the fourth height of the fourth photoresist pattern.

The pixel electrodes may be formed of a transparent conductive material.

The conductive layer may be formed of a transparent conductive layer.

The method may further include forming a plurality of second touch electrodes spaced from the first touch electrodes.

The second touch electrodes may be driven, together with the first touch electrodes, as capacitive touch sensors.

The second touch electrodes may be formed of a transparent conductive material.

The second touch electrodes may be on a second substrate opposite to the first substrate with a liquid crystal layer interposed therebetween.

The second touch electrodes cross the first touch electrodes.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 2 is a diagram illustrating first touch electrodes and driving lines in the liquid crystal display having a touch sensor, according to an example embodiment of the present invention.

FIG. 3 is a diagram illustrating second touch electrodes in the liquid crystal display having a touch sensor, according to an example embodiment of the present invention.

DETAILED DESCRIPTION

Figure 1:
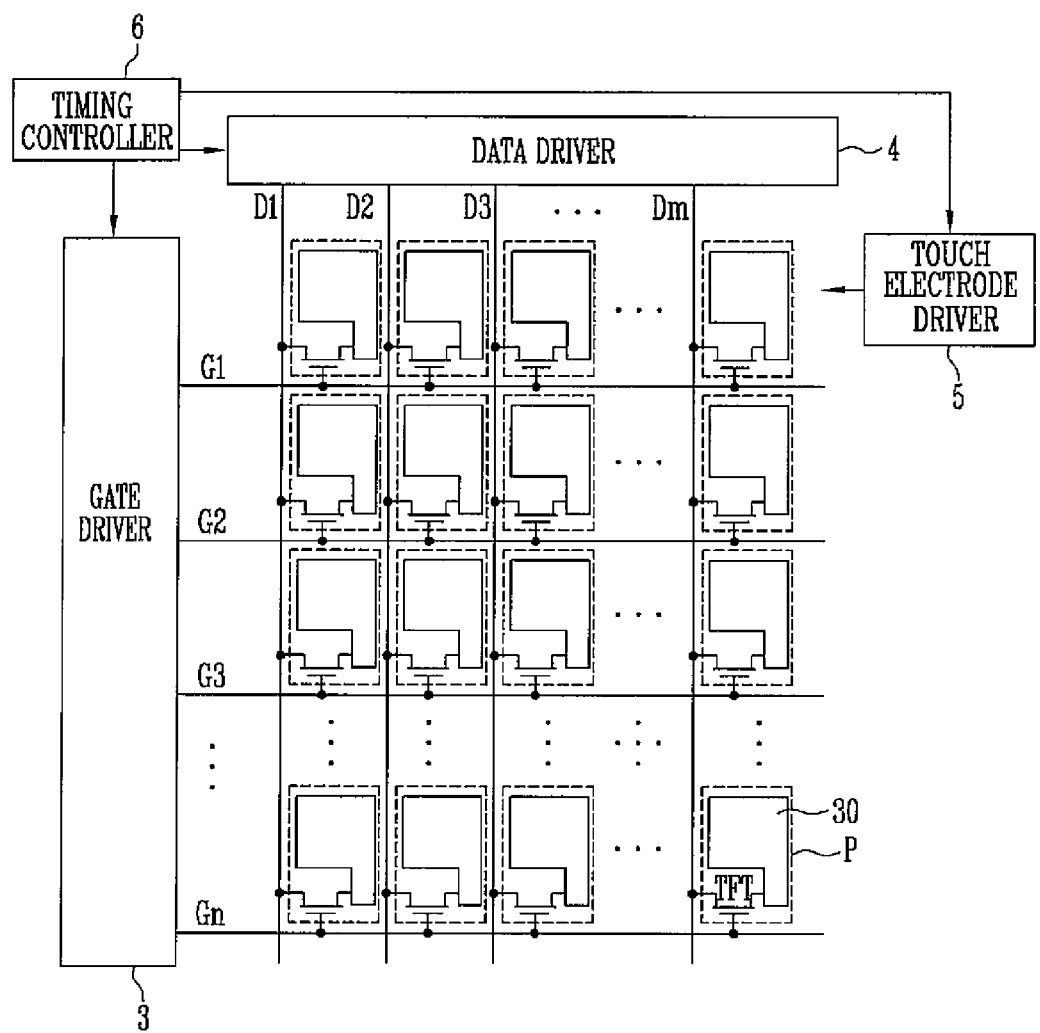
FIG. 1 is a diagram illustrating a liquid crystal display having a touch sensor, according to an example embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the another element or be indirectly on the another element with one or more intervening elements interposed therebetween. Also, when an element is referred to as being "connected to" or "coupled to" another element, it can be directly connected to the another element or be indirectly connected to the another element with one or more intervening elements interposed therebetween. Hereinafter, like reference numerals refer to like elements.

FIG. 1 is a diagram illustrating a liquid crystal display having a touch sensor, according to an example embodiment of the present invention. FIG. 2 is a diagram illustrating first touch electrodes and driving lines in the liquid crystal display having a touch sensor, according to an example embodiment of the present invention.

Figure 4:
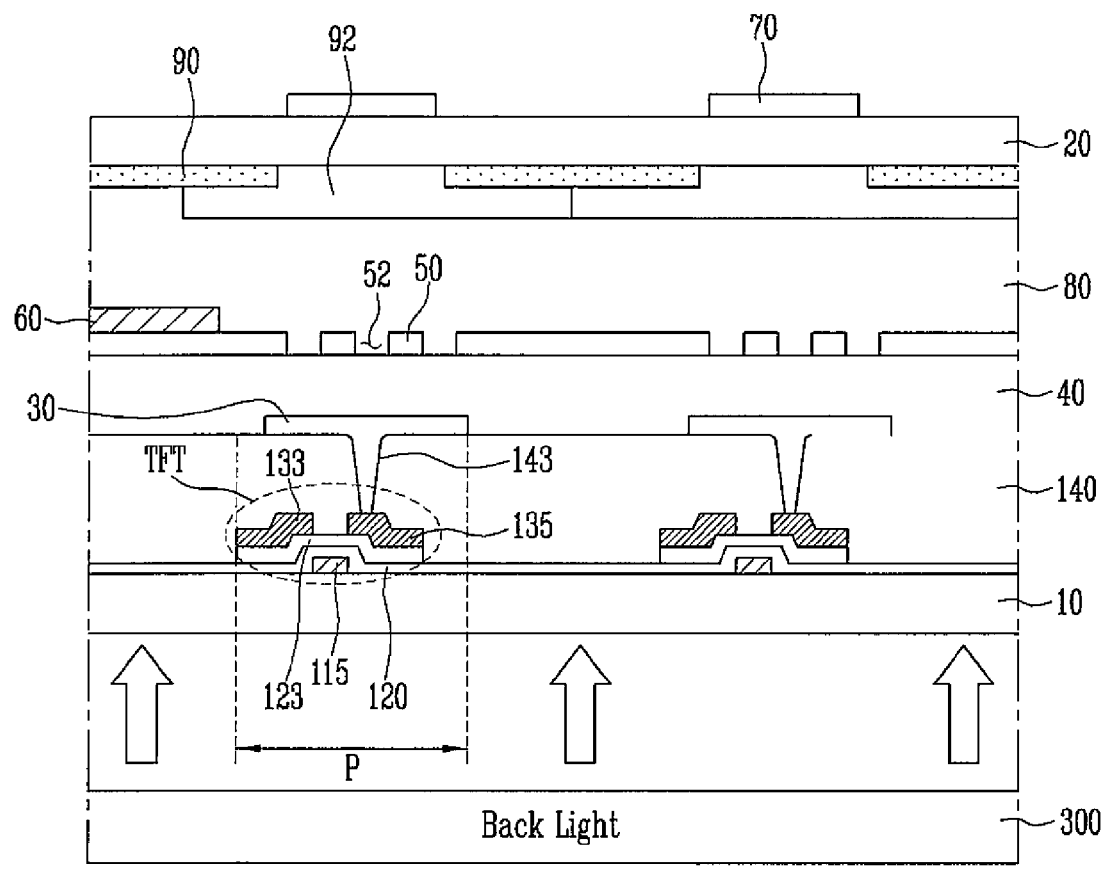
FIG. 4 is a cross-sectional view of the liquid crystal display having a touch sensor, according to an example embodiment of the present invention.

FIG. 3 is a diagram illustrating second touch electrodes in the liquid crystal display having a touch sensor, according to an example embodiment of the present invention. FIG. 4 is a cross-sectional view of the liquid crystal display having a touch sensor, according to an example embodiment of the present invention.

For example, FIG. 4 illustrates a section taken along the line A-B in FIG. 3. For convenience of illustration, sections of thin film transistors TFT and pixel electrodes 30 are also illustrated in FIG. 4.

Referring to FIGS. 1 to 4, the liquid crystal display having a touch sensor, according to an embodiment, may include a first substrate 10, pixels P, pixel electrodes 30, an insulating layer 40, first touch electrodes 50, driving lines 60, a liquid crystal layer 80, a second substrate 20 and second touch electrodes 70.

Gate lines G1 to Gn and data lines D1 to Dm, which cross each other, may be arranged on the substrate 10.

A plurality of pixels P coupled to (e.g., connected to) the gate lines and the data lines may also be positioned on the substrate 10.

In this embodiment, the pixel P may include a thin film transistor TFT coupled to a gate line and a data line, and a pixel electrode 30 coupled to the thin film transistor TFT.

A back-light 300 configured to provide light for image display may be positioned below the first substrate 10.

The first substrate 10 may include a display area in which the plurality of pixels P are positioned to display an image, and a non-display area in which various kinds of drivers and lines are positioned.

A gate driver 3, a data driver 4, a touch electrode driver 5 and a timing controller 6 may be positioned in the non-display area. Here, the gate driver 3 supplies a gate signal to the gate lines G1 to Gn, and the data driver 4 supplies a data signal to the data lines D1 to Dm. The touch electrode driver 5 supplies a touch driving signal Sd and a common voltage Vcom to the first touch electrode 50 through the driving line 60, and the timing controller 6 controls the drivers.

The thin film transistors TFT are positioned at crossing regions (e.g., crossing points) of the gate lines G1 to Gn and the data lines D1 to Dm. The thin film transistor TFT may be coupled to the pixel electrode 30 included in each pixel P.

As shown in FIG. 4, the thin film transistor TFT may be positioned on the first substrate 10.

The thin film transistor TFT may be configured to include a gate electrode 115 coupled to the gate line, source/drain electrodes 133 and 135, and an active pattern layer 123 formed between the gate electrode 115 and the source/drain electrodes 133 and 135.

A gate insulating layer 120 may be formed on the gate electrode 115, and a protective layer 140 may be formed on the source/drain electrodes 133 and 135.

The gate insulating layer 120 and the protective layer 140 may be formed of an insulating material, such as silicon oxide (SiOx) or silicon nitride (SiNx).

The protective layer 140 may have a contact hole 143 that allows the source or drain electrode 133 or 135 to be exposed therethrough. In FIG. 4, an example in which the drain electrode 135 is exposed through the contact hole 143 has been illustrated as one example.

The gate electrode 115 and the source/drain electrodes 133 and 135 may be formed of a metal, such as molybdenum (Mo), tungsten (W), titanium (Ti) or aluminum (Al), an alloy, and/or a stacked structure thereof. However, the present invention is not limited thereto.

Pixel electrodes 30 are formed on the protective layer 140. The pixel electrode 30 may be coupled to the source or drain electrode 133 or 135 through the contact hole 143. In FIG. 4, an embodiment in which the pixel electrode 30 is coupled to the drain electrode 135 through the contact hole 143 has been illustrated as an example.

In one example embodiment the pixel electrode 30 is formed of a transparent conductive material to increase the transmittance of light provided from the back-light 300. However, the pixel electrode 30 may also be formed of another conductive material, such as an opaque metal.

For example, the pixel electrode 30 may be formed of a material including indium tin oxide (ITO), indium zinc oxide (IZO), graphene, carbon nanotube, silver nanowires (AgNWs), and/or the like.

An insulating layer 40 may be formed on the pixel electrodes 30 and the protective layer 140.

The insulating layer 40 may be formed of an insulating material, such as silicon oxide (SiOx) or silicon nitride (SiNx).

In this example, a plurality of first touch electrodes 50 and a plurality of driving lines 60 may be positioned on the insulating layer 40.

Referring to FIG. 2, the first touch electrode 50 may extend along a first direction (e.g., a horizontal direction), and the plurality of first touch electrodes 50 may be arranged along a second direction (e.g., a vertical direction).

In this embodiment, the first touch electrode 50 may correspond to pixels P on at least one row. For example, an embodiment in which the first touch electrode 50 is positioned corresponding to pixels P on one row has been illustrated in FIG. 2. However, the first touch electrode 50 may be positioned corresponding to pixels P on several rows.

To create (or form) an electric field between the first touch electrode 50 and the pixel electrodes 30 of the pixels P corresponding to the first touch electrode 50, in one example embodiment, a plurality of openings 52 are formed in the first touch electrode 50.

Although it has been illustrated in FIG. 2 that each pixel P corresponds to three openings 52, this configuration merely represents one embodiment, and other embodiments may not be limited thereto.

In one example embodiment, the first touch electrode 50 is formed of a transparent conductive material. However, the first touch electrode 50 may also be formed of another conductive material, such as an opaque metal.

For example, the first touch electrode 50 may be formed of material including ITO, IZO, graphene, carbon nanotube, AgNWs, and/or the like.

The driving line 60 is coupled to one end of the first touch electrode 50, so that the touch driving signal Sd and the common voltage Vcom can be transmitted to the first touch electrode 50 therethrough.

To this end, the driving line 60 may electrically couple the first touch electrode 50 and the touch electrode driver 5 together.

For example, the driving line 60 is formed to extend along the non-display area from the one end of the first touch electrode 50, so as to be coupled to the touch electrode driver 5 through a separate pad portion.

The driving line 60 may be formed of a low-resistance metal, such as Mo, silver (Ag), Ti, copper (Cu), Al, and/or Mo/Al/Mo.

The second substrate 20 is positioned opposite to the first substrate 10, and a liquid crystal layer 80 may be interposed between the first and second substrates 10 and 20.

A lattice-shaped black matrix 90 may be formed on the second substrate 20. Here, the black matrix 90 surrounds the region of each pixel P to cover the region in which the gate lines G1 to Gn, the data lines D1 to Dm, the thin film transistors TFT, the driving lines 60, etc. are positioned.

Color filter pattern 92, arranged corresponding to the respective pixels P, may exist inside the black matrix 90.

The first and second substrates 10 and 20 may be made of a material having insulating properties, such as glass, plastic, silicon and/or synthetic resin.

In addition, the first and second substrates 10 and 20 may be implemented as films having flexibility so as to be bendable or foldable.

Second touch electrodes 70 may be formed on the second substrate 20. Here, the second touch electrodes 70 may be driven, together with the first touch electrodes 50, as a mutual capacitive touch sensor.

Referring to FIG. 3, a plurality of second touch electrodes 70 may be arranged to cross the first touch electrodes 50. For example, the second touch electrode 70 may extend along the second direction (e.g., the vertical direction), and the plurality of second touch electrodes 70 may be arranged in the first direction (e.g., the horizontal direction).

The second touch electrode 70 may be formed of a transparent conductive material. However, the second touch electrode 70 may also be formed of another conductive material, such as an opaque metal.

For example, the second touch electrode 70 may be formed of material including ITO, IZO, graphene, carbon nanotube, AgNWs, and/or the like.

An image display operation of the liquid crystal display having the touch sensor configured as described above will be briefly described as follows.

First, if a gate signal is supplied to the gate electrode 115 of the thin film transistor TFT provided in each pixel P, the active pattern layer 123 is activated, and accordingly, the source electrode 133 may transmit a data signal supplied from the data line coupled to the source electrode 133 to the drain electrode 135 spaced from the source electrode 133 at an interval (e.g., a predetermined interval) via the lower active pattern layer 123.

In this embodiment, the drain electrode 135 is electrically coupled to the pixel electrode 30 through the contact hole 143, and thus the voltage of the data signal may be applied to the pixel electrode 30.

Accordingly, the arrangement of liquid crystal molecules in the liquid crystal layer 80 is controlled by a voltage corresponding to the difference between the voltage applied to the pixel electrode 30 and the voltage applied to the first touch electrode 50, thereby displaying an image (e.g., a predetermined image).

In the liquid crystal display having the touch sensor, according to this embodiment, the first touch electrode 50 performs the function of a common electrode during an image display period. Thus, the plurality of first touch electrodes 50 may receive the same common voltage Vcom applied during the image display period.

In the related art liquid crystal display, one common electrode integrally formed was used. However, in the liquid crystal display having the touch sensor according to this embodiment, the common electrode is divided into a plurality of electrodes used as the plurality of first touch electrodes 50, so that the common electrode of the related art liquid crystal display may be used as a capacitive touch electrode.

To this end, the touch driving signal Sd, other than the common voltage, may be transmitted to the first touch electrode 50 during a touch driving period.

The touch driving signal Sd may be sequentially (e.g., progressively) supplied to the plurality of first touch electrodes 50 to detect multiple touches.

The mutual capacitance between the first and second touch electrodes 50 and 70 is formed at crossing regions of the first and second touch electrodes 50 and 70. Each crossing region at which the mutual capacitance is formed may be operated as a sensing cell that implements touch recognition.

In an embodiment in which the touch driving signal Sd is supplied to the first touch electrode 50 coupled to each sensing cell, the mutual capacitance generated in each sensing cell generates a sensing signal coupled to the second touch electrode 70 coupled to each sensing cell. Thus, in the event that a user's finger or the like comes in contact with the liquid crystal display, a change in mutual capacitance occurs. Accordingly, the sensing signal is also changed, thereby registering (or recognizing) a touch.

To perform the image display operation, the touch electrode driver 5 may apply the common voltage Vcom to the first touch electrode 50 through the driving line 60 during the image display period.

To perform a touch sensing operation, the touch electrode driver 5 may supply the touch driving signal Sd to the first touch electrode 50 through the driving line 60 during the touch driving period.

FIGS. 5A to 5G are cross-sectional views illustrating a process of forming a thin film transistor in a manufacturing method of the liquid crystal display having a touch sensor, according to an example embodiment of the present invention.

Referring to FIGS. 5A to 5G, the manufacturing method, according to this embodiment, may include a process of forming a thin film transistor.

Hereinafter, the process of forming the thin film transistor will be sequentially described with reference to FIGS. 5A to 5G.

Figure 5A:
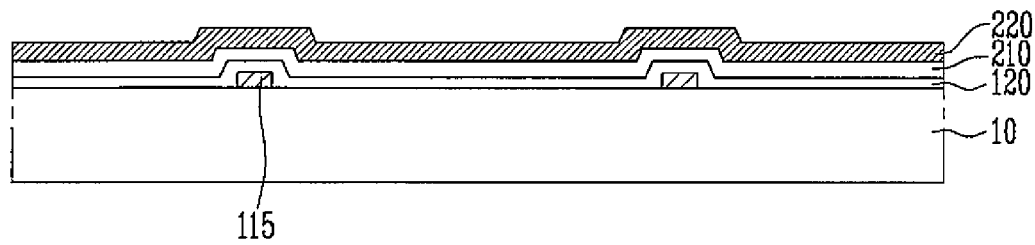
FIGS. 5A to 5G are cross-sectional views illustrating a process of forming a thin film transistor in a manufacturing method of the liquid crystal display having a touch sensor, according to an example embodiment of the present invention.

Referring to FIG. 5A, a gate electrode 115 is first formed on a first substrate 10, and a gate insulating layer 120 is then formed on the gate electrode 115.

Subsequently, an active layer 210 and a first metal layer 220 are sequentially formed on the gate insulating layer 120.

For example, the active layer 210 may be first formed entirely on the gate insulating layer 120, and the first metal layer 220 may be again formed entirely on the active layer 210.

The active layer 210 may be formed of poly silicon obtained by crystallizing amorphous silicon deposited on the first substrate 10, using laser or the like.

The active layer 210 may be formed of amorphous silicon, oxide semiconductor, poly silicon, and/or the like.

Next, the active layer 210 and the first metal layer 220 are patterned, thereby forming source/drain electrodes 133 and 135 and an active pattern layer 123 of a thin film transistor TFT.

Figure 5B:
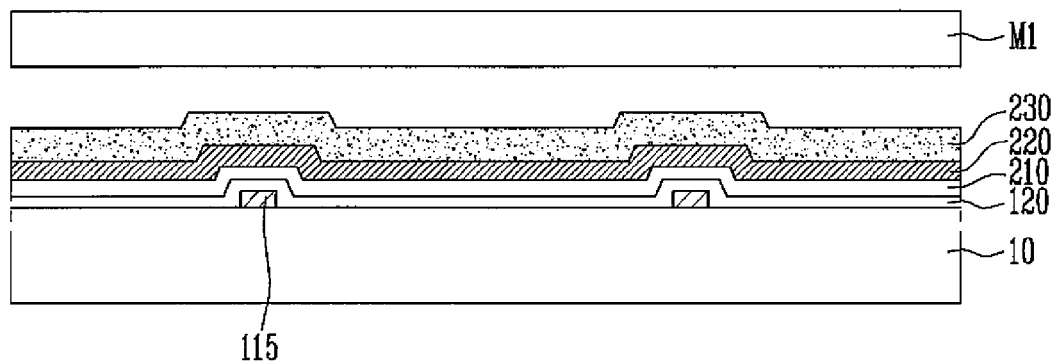

Referring to FIG. 5B, a first photoresist layer 230 is first formed on the first metal layer 220.

Accordingly, the first photoresist layer 230 may be entirely laminated on the first metal layer 220.

Figure 5C:
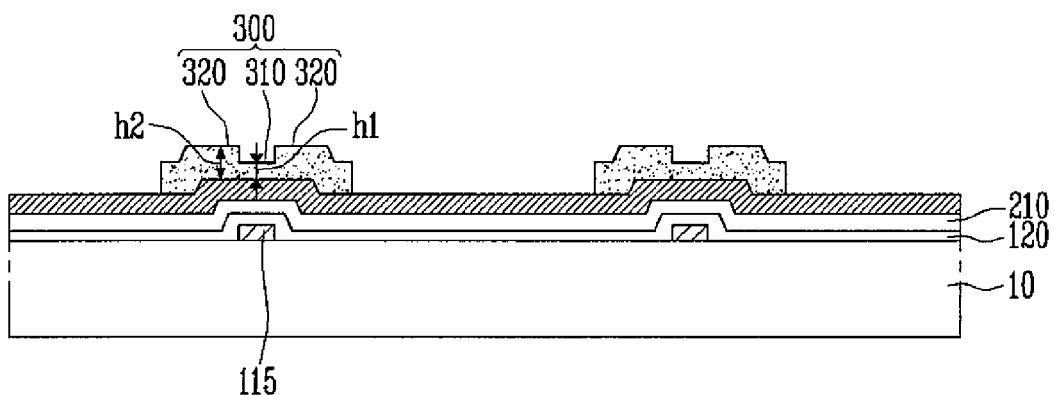

Subsequently, the first photoresist layer 230 is patterned using a half-tone mask M1, thereby forming photoresist patterns 300 spaced from each other as shown in FIG. 5C. Here, each photoresist pattern 300 includes a first photoresist pattern 310 having a first height h1 and second photoresist patterns 320 having a second height h2, and the second photoresist patterns 320 are spaced from each other, with the first photoresist pattern 310 interposed therebetween.

A half-tone mask may include a light transmitting portion, a light shielding portion configured to completely shield light, and a semi-transmitting portion configured to control transmittance so that a portion of light is transmitted. Thus, pattern layers having different heights for each position may be formed using the half-tone mask.

Accordingly, the first photoresist layer 230 is formed on the first metal layer 220, and an exposure and development process is then performed on the first photoresist layer 230 through the first half-tone mask M1, thereby forming the first and second photoresist patterns 310 and 320 having different heights.

In this example, the first height h1 of the first photoresist pattern 310 may be lower than the second height h2 of the second photoresist pattern 320 as shown in FIG. 5C.

The first photoresist pattern 310 is positioned on the first metal layer 220 which is removed so that the source and drain electrodes 133 and 135 are separated (e.g., electrically isolated) from each other, and the second photoresist patterns 320 are positioned in regions where the source and drain electrodes 133 and 135 are to be formed, respectively.

To this end, the second photoresist patterns 320 may be positioned at both sides of the first photoresist pattern 310 of which height is lower than that of the second photoresist pattern 320.

Figure 5D:
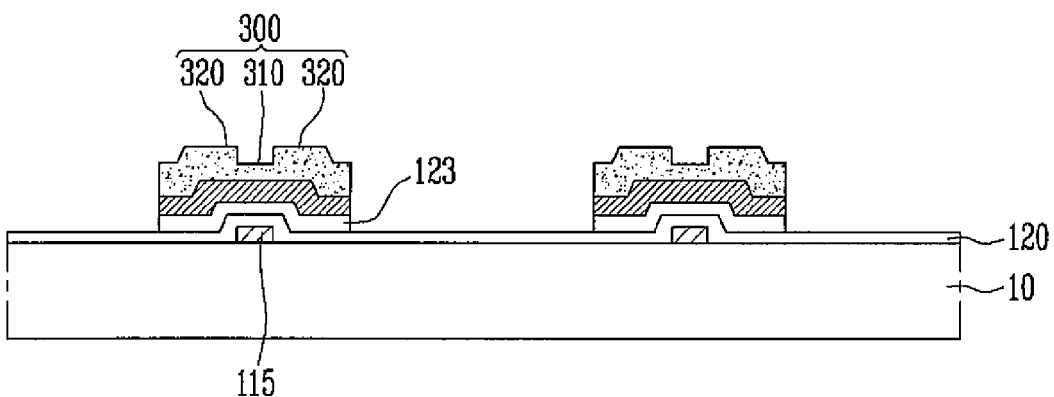

Referring to FIG. 5D, the first metal layer 220 and the active layer 210, exposed between the photoresist patterns 300 are removed.

Because the photoresist patterns 300 are positioned to be spaced from each other, the first metal layer 220 and the active layer 210, which are not covered by the photoresist patterns 300 are exposed between the photoresist patterns 300.

Thus, the exposed first metal layer 220 and the exposed active layer 210 may be removed through an etching process as shown in FIG. 5D.

As a result, the gate insulating layer 120 positioned beneath the removed active layer 210 may be removed together with the active layer 210. However, the gate insulating layer 120 may remain as shown in FIG. 5D.

Figure 5E:
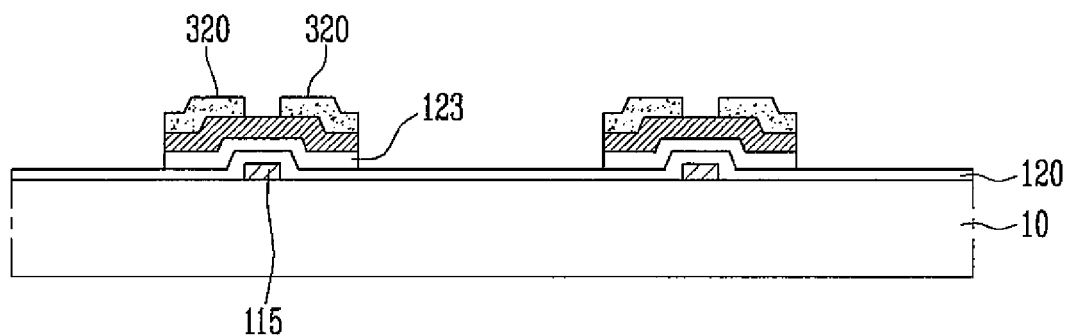

Next, as shown in FIG. 5E, the first photoresist pattern 310 is removed.

The removal of the first photoresist pattern 310 may be performed through an ashing process (e.g., a plasma ashing process) or the like. Further, an upper portion of the second photoresist pattern 320 may also be removed so that the height of the second photoresist pattern 320 is lowered.

Accordingly, a portion of the first metal layer 220 positioned beneath the first photoresist pattern 310 may be exposed to the outside.

Figure 5F:
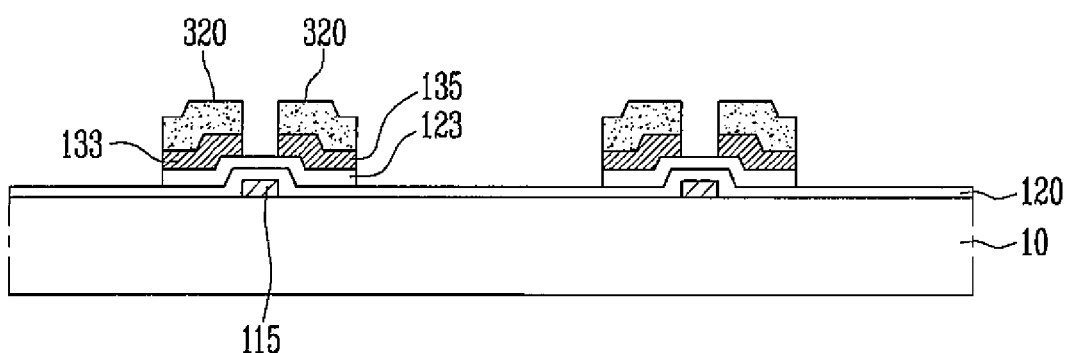

Subsequently, as shown in FIG. 5F, the first photoresist pattern 310 is removed, thereby removing the first metal layer 220 exposed to the outside.

Thus, the first metal layer 220 exposed through the space between the second photoresist patterns 320 may be removed through an etching process.

In this example, the first metal layer 220 covered by the second photoresist patterns 320 is not removed but is maintained as it is.

Thus, the first metal layers 220 respectively positioned beneath the photoresist patterns 300 are separated (e.g., electrically isolated) from each other, thereby becoming (or forming) the source and drain electrodes 133 and 135.

In this example, the source and drain electrodes 133 and 135 are positioned beneath the remaining second photoresist pattern 320.

The active layer 210 remaining beneath the source and drain electrodes 133 and 135 may become the active pattern layer 123.

Figure 5G:
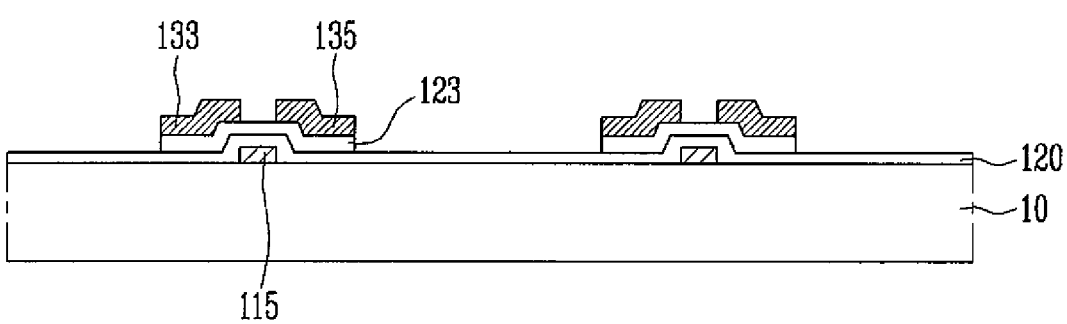

Subsequently, referring to FIG. 5G, the remaining photoresist patterns 320 are removed.

Thus, the thin film transistor TFT may be formed through the procedure described above, using only one first half-tone mask M1.

In contrast, in a related art manufacturing method, a first mask was used to form the active pattern layer 123, and a second mask was used to form the source/drain electrodes 133 and 135.

Accordingly, in the manufacturing method of the present invention, only one mask is used, as compared with the related art manufacturing method, thereby reducing manufacturing time, cost, etc.

Figure 6A:
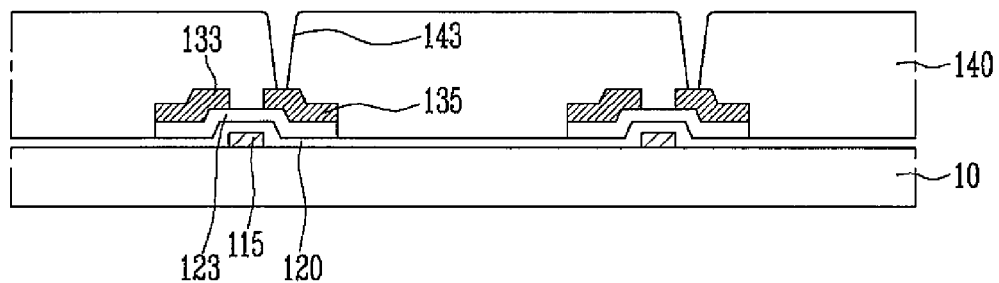
FIGS. 6A and 6B are cross-sectional views illustrating a process of forming a pixel electrode in the manufacturing method of the liquid crystal display having a touch sensor, according to an example embodiment of the present invention.
Figure 6B:
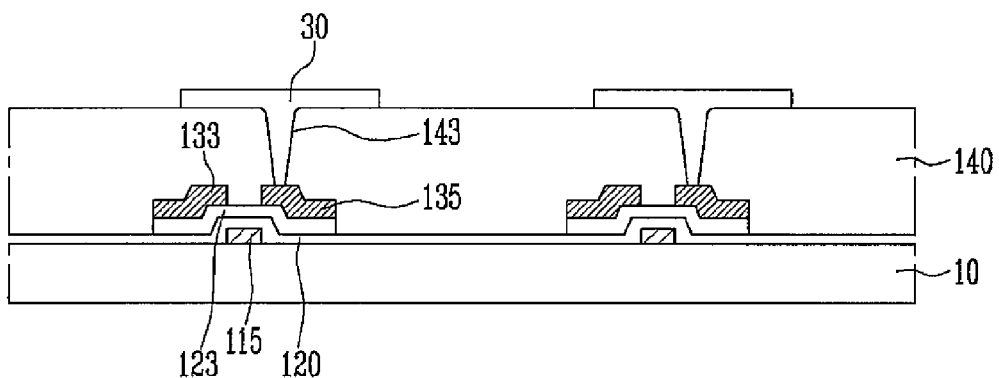

FIGS. 6A and 6B are cross-sectional views illustrating a process of forming a pixel electrode in the manufacturing method of the liquid crystal display having a touch sensor, according to an example embodiment of the present invention.

Hereinafter, the process of forming the pixel electrode will be described with reference to FIGS. 6A and 6B.

First, referring to FIG. 6A, a protective layer 140 having a contact hole 143 formed therein is formed on the thin film transistor TFT.

In this embodiment, the contact hole 143 may be positioned on the source or drain electrodes 133 or 135. In FIG. 6A, an embodiment in which the contact hole 143 is formed on the drain electrode 135 has been illustrated as an example.

Subsequently, referring to FIG. 6B, a pixel electrode 30 coupled to the thin film transistor TFT is formed on the protective layer 140. The pixel electrode 30 may be electrically coupled to the source or drain electrode 133 or 135 of the thin film transistor TFT through the contact hole 143 formed in the protective layer 140. In FIG. 6b, an embodiment in which the pixel electrode 30 is coupled to the drain electrode 135 through the contact hole 143 has been illustrated as an example.

Figure 7:
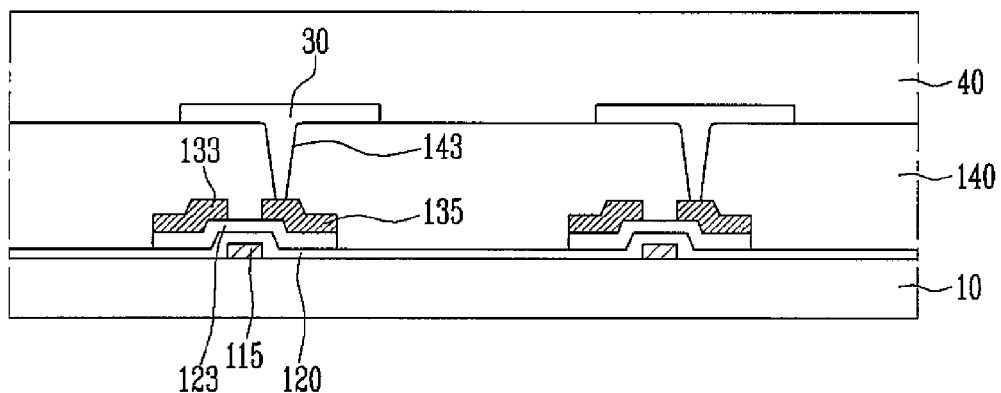
FIG. 7 is a cross-sectional view illustrating a process of forming an insulating layer in the manufacturing method of the liquid crystal display having a touch sensor, according to an example embodiment of the present invention.

FIG. 7 is a cross-sectional view illustrating a process of forming an insulating layer in the manufacturing method of the liquid crystal display having the touch sensor, according to an example embodiment of the present invention.

Referring to FIG. 7, an insulating layer 40 may be formed on the pixel electrode 30 in the process of forming the insulating layer.

For example, to insulate the pixel electrode 30 from the first touch electrode 50 (e.g., as shown in the embodiment of FIG. 3), the insulating layer 40 may be entirely formed on the pixel electrode 30 and the protective layer 140.

FIGS. 8A to 8F are cross-sectional views illustrating a process of forming a first electrode and a driving line in the manufacturing method of the liquid crystal display having a touch sensor, according to an example embodiment of the present invention.

Hereinafter, the process of forming the first electrode and the driving line, positioned on the insulating layer 40, will be described with reference to FIGS. 8A to 8F.

Figure 8A:
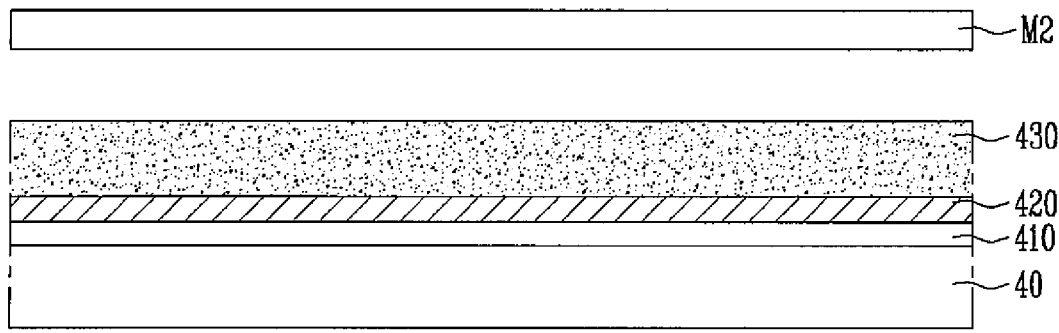
FIGS. 8A to 8F are cross-sectional views illustrating a process of forming a first electrode and a driving line in the manufacturing method of the liquid crystal display having a touch sensor, according to an example embodiment of the present invention.
Figure 8B:
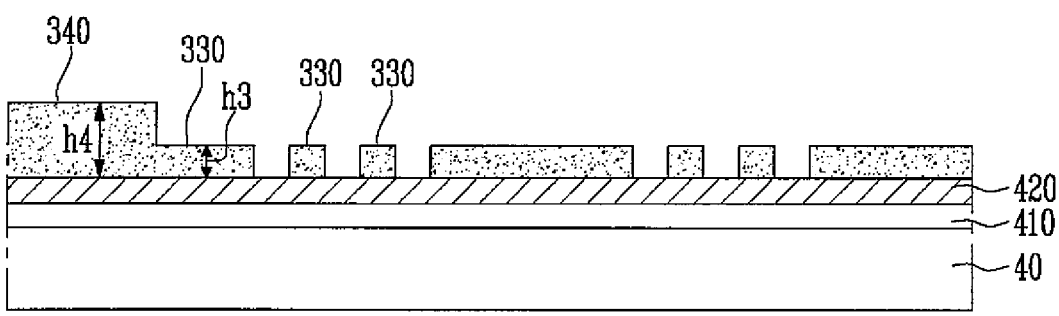

Referring to FIG. 8A, a conductive layer 410 and a second metal layer 420 are sequentially formed (e.g., laminated) on the insulating layer 40.

For example, the conductive layer 410 may be first formed entirely on the insulating layer 40, and the second metal layer 420 may be then formed entirely on the conductive layer 410.

Subsequently, a second photoresist layer 430 is formed on the second metal layer 420.

Next, the second photoresist layer 430 is patterned using a second half-tone mask M2, thereby forming a third photoresist pattern 330 having a third height h3 and a fourth photoresist pattern 340 having a fourth height h4.

As such, an exposure and development process is performed on the second photoresist layer 430 through the second half-tone mask M2, thereby forming the third and fourth photoresist patterns 330 and 340 having different heights.

In this embodiment, the third height h3 of the third photoresist pattern 330 may be lower than the fourth height h4 of the fourth photoresist pattern 340.

The third photoresist pattern 330 may be positioned in a region where the first touch electrode 50 is to be formed, and the fourth photoresist pattern 340 may be positioned in a region where the driving line 60 is to be formed.

The portion at which the photoresist patterns 330 and 340 may become a region where an opening 52 of the first touch electrode 50 is to be formed.

Figure 8C:
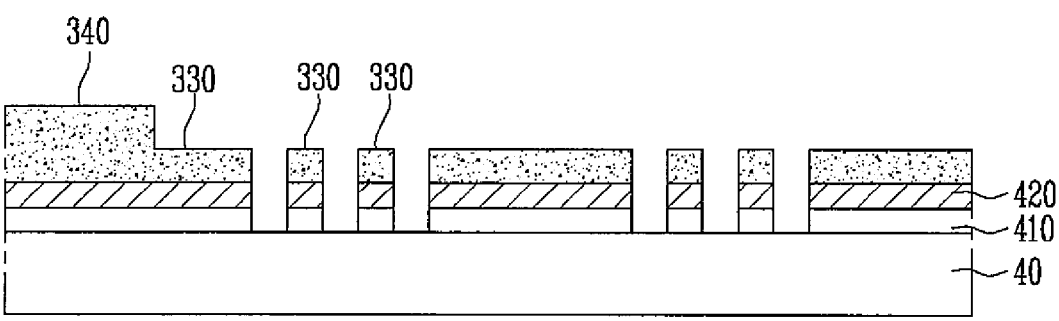

Referring to FIG. 8C, the second metal layer 420 and the conductive layer 410, positioned in a region where the third and fourth photoresist patterns 330 and 340 are not formed, are removed.

For example, as shown in FIG. 8C, portions of the second metal layer 420 and the conductive layer 410, which are not covered by the third and fourth photoresist patterns 330 and 340, may be removed through an etching process.

Thus, the opening 52 in the first touch electrode 50 may be formed through the procedure described above.

Figure 8D:
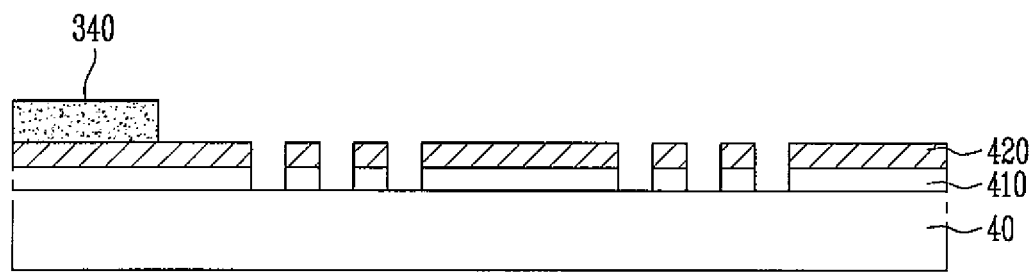

Next, as shown in FIG. 8D, the third photoresist pattern 330 is removed.

The removing of the third photoresist pattern 330 may be performed through an ashing process (e.g., a plasma ashing process) or the like. In this example, an upper portion of the fourth photoresist pattern 340 may also be removed so that the height of the fourth photoresist pattern 340 is lowered.

Accordingly, a portion of the second metal layer 420 positioned beneath the third photoresist pattern 330 and not covered thereby is exposed to the outside.

Figure 8E:
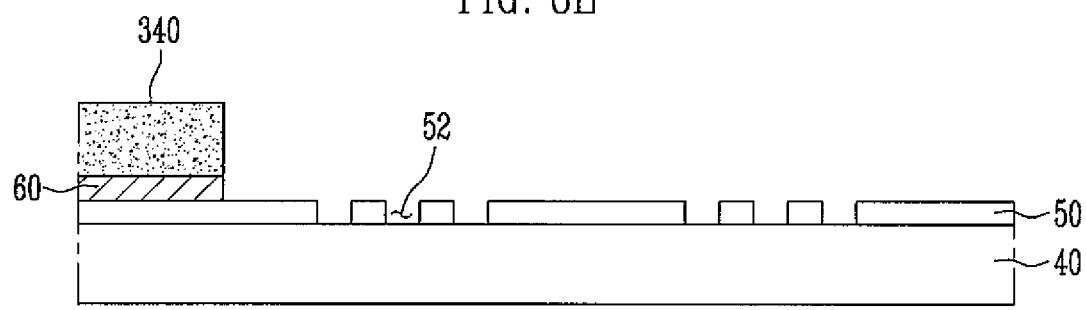

Subsequently, as shown in FIG. 8E, the third photoresist pattern 330 is removed, thereby removing the second metal layer 420 exposed to the outside.

In this example, the second metal layer 420 covered by the fourth photoresist pattern 340 is not removed but is maintained as it is.

Thus, the forming of the first touch electrode 50 may be completed through the procedure described above.

Figure 8F:
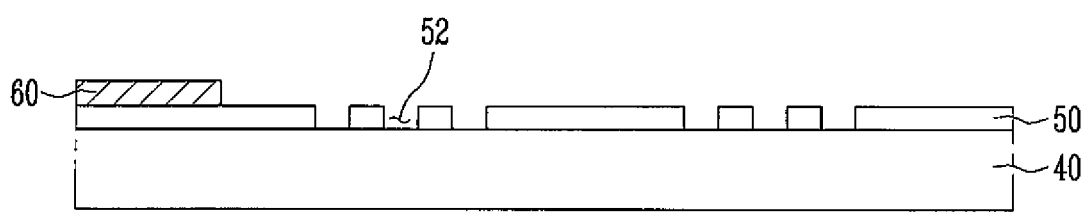

Subsequently, referring to FIG. 8F, the remaining fourth photoresist pattern 340 is removed. Accordingly, the forming of the driving line 60 is completed.

Thus, the first touch electrode 50 and the driving line 60 may be formed through the procedure described above, using only one second half-tone mask M2.

That is, in the related art manufacturing method, a first mask was used to form the first touch electrode 50, and a second mask was used to form the driving line 60.

Accordingly, in the manufacturing method of the present invention, only one mask is used, as compared with the related art manufacturing method, thereby reducing manufacturing time, cost, etc.

The manufacturing method according to this embodiment may further include a process of forming a second touch electrode 70.

The second touch electrode 70 may be positioned to be spaced from the first touch electrode 50.

To this end, the second touch electrode 70 may be positioned on a second substrate 20. As shown in FIG. 4, the second touch electrode 70 may be positioned on the second substrate 20.

The second touch electrode 70 may be positioned to cross the first touch electrode 50.

By way of summation and review, the related art touch sensor was frequently commercialized by being manufactured separately from a liquid crystal display and then attached to an outer surface of the liquid crystal display.

However, in an example where the touch sensor is attached to the outer surface of the liquid crystal display, a cohesive layer between the touch sensor and the liquid crystal display is necessary, and a process of forming the touch sensor is required separately from the liquid crystal display. Therefore, process time and cost is increased. Further, as the touch sensor is attached to the outer surface of the liquid crystal display, the entire thickness of the liquid crystal display is increased.

Accordingly, a liquid crystal display having a touch sensor has recently come into the spotlight, in which a common electrode of the liquid crystal display is used as a touch sensing electrode. However, it is desirable for the manufacturing process of the liquid crystal display to be further simplified to reduce manufacturing time and cost.

As described above, according to the present invention, it is possible to provide a liquid crystal display having a touch sensor, which may reduce manufacturing time and cost by decreasing the number of masks used in the manufacturing process.

Example embodiments have been disclosed herein, and although specific terms are employed, they are used and are to be interpreted in a generic and descriptive sense only and not for purpose of limitation. In some instances, as would be apparent to one of ordinary skill in the art at the time of filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims, and equivalents thereof.

What is claimed is:

1. A method of manufacturing a liquid crystal display having a touch sensor, the method comprising:
    forming a plurality of thin film transistors on a first substrate;
    forming a plurality of pixel electrodes each coupled to a corresponding one of the thin film transistors;
    forming an insulating Layer on the pixel electrodes; and
    forming, on the insulating layer, a plurality of first touch electrodes each having openings formed therein and a plurality of driving lines coupled to the first touch electrodes.

2. The method of claim 1, wherein the forming of the thin film transistors comprises:
    forming a gate electrode on the first substrate, and forming a gate insulating layer on the gate electrode;
    sequentially forming an active layer and a first metal layer on the gate insulating layer; and
    patterning the active layer and the first metal layer to form a source electrode, a drain electrode and an active pattern layer of the thin film transistors.

3. The method of claim 2, wherein the forming of the source electrode, the drain electrode, and the active pattern layer of the thin film transistors comprises:
    forming a first photoresist layer on the first metal layer;
    patterning the first photoresist layer, using a first half-tone mask, to form photoresist patterns spaced from each other, wherein each of the photoresist patterns comprises a first photoresist pattern having a first height and second photoresist patterns having a second height;
    removing a portion of the first metal layer and a portion of the active layer exposed between the photoresist patterns;
    removing the first photoresist pattern; and
    removing a portion of the first metal layer exposed to the outside by removing the first photoresist pattern.

4. The method of claim 3, wherein the forming of the source electrode, the drain electrode, and the active pattern layer of the thin film transistors further comprises:
    removing a portion of the second photoresist patterns remaining after the removing of the portion of the first metal layer exposed to the outside by removing the first photoresist pattern.

5. The method of claim 3, wherein, after the removing of the portion of the first metal layer exposed to the outside by removing the first photoresist pattern, a portion of the first metal layer that remains forms the source or drain electrode, and a portion of the active layer that remains forms the active pattern layer.

6. The method of claim 3, wherein the first height of the first photoresist pattern is lower than the second height of the second photoresist patterns.

7. The method of claim 3, wherein the second photoresist patterns are coupled to both sides of the first photoresist pattern.

8. The method of claim 1, wherein the forming of the first touch electrodes and the driving lines comprises:
    sequentially forming a conductive layer and a second metal layer on the insulating layer;
    forming a second photoresist layer on the second metal layer;
    patterning the second photoresist layer, using a second half-tone mask, to form a third photoresist pattern having a third height and a fourth photoresist pattern having a fourth height;
    removing portions of the second metal layer and the conductive layer positioned in a region where the third and fourth photoresist patterns are not positioned;
    removing the third photoresist pattern; and
    removing a portion of the second metal layer exposed to the outside by removing the third photoresist pattern.

9. The method of claim 8, wherein the forming of the first touch electrodes and the driving lines further comprises:

removing a portion of the fourth photoresist pattern remaining after the removing of the portion of the second metal layer exposed to the outside by removing the third photoresist pattern.

10. The method of claim 8, wherein, after the removing of the portion of the second metal layer exposed to the outside by removing the third photoresist pattern, a portion of the conductive layer that remains forms a corresponding one of the first touch electrodes, and a portion of the second metal layer that remains forms a corresponding one of the driving lines.

11. The method of claim 8, wherein the third height of the third photoresist pattern is lower than the fourth height of the fourth photoresist pattern.

12. The method of claim 1, wherein the pixel electrodes are formed of a transparent conductive material.

13. The method of claim 8, wherein the conductive layer is formed of a transparent conductive layer.

14. The method of claim 1, further comprising forming a plurality of second touch electrodes spaced from the first touch electrodes.

15. The method of claim 14, wherein the second touch electrodes are driven, together with the first touch electrodes, as capacitive touch sensors.

16. The method of claim 14, wherein the second touch electrodes are formed of a transparent conductive material.

17. The method of claim 14, wherein the second touch electrodes are on a second substrate opposite to the first substrate with a liquid crystal layer interposed therebetween.

18. The method of claim 14, wherein the second touch electrodes cross the first touch electrodes.

* * * * *